United States Patent
Wu et al.

(10) Patent No.: US 8,823,170 B2
(45) Date of Patent: Sep. 2, 2014

(54) APPARATUS AND METHOD FOR THREE DIMENSIONAL INTEGRATED CIRCUITS

(71) Applicant: Taiwan Semiconductor Manufacturing Company, Ltd., Hsin-Chu (TW)

(72) Inventors: Sheng-Yu Wu, Hsin-Chu (TW);
Pei-Chun Tsai, Zhongli (TW);
Chih-Horng Chang, Taipei (TW);
Tin-Hao Kuo, Hsin-Chu (TW);
Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/706,436

(22) Filed: Dec. 6, 2012

(65) Prior Publication Data

US 2014/0159232 A1    Jun. 12, 2014

(51) Int. Cl.
*H01L 23/48*        (2006.01)
*H01L 21/50*        (2006.01)
*H01L 23/498*       (2006.01)

(52) U.S. Cl.
CPC .......... *H01L 23/49811* (2013.01); *H01L 21/50* (2013.01)
USPC ........... 257/737; 257/676; 257/697; 257/707; 257/720; 257/773

(58) Field of Classification Search
None
See application file for complete search history.

(56) References Cited

U.S. PATENT DOCUMENTS

2004/0084205 A1 *  5/2004  Chang et al. ................. 174/250

* cited by examiner

*Primary Examiner* — Kyoung Lee
(74) *Attorney, Agent, or Firm* — Slater and Matsil, L.L.P.

(57) ABSTRACT

A structure comprises a substrate comprising a plurality of traces on top of the substrate, a plurality of connectors formed on a top surface of a semiconductor die, wherein the semiconductor die is formed on the substrate and coupled to the substrate through the plurality of connectors and a dummy metal structure formed at a corner of a top surface of the substrate, wherein the dummy metal structure has two discontinuous sections.

20 Claims, 5 Drawing Sheets

US 8,823,170 B2

APPARATUS AND METHOD FOR THREE DIMENSIONAL INTEGRATED CIRCUITS

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, three-dimensional integrated circuit devices have emerged as an effective alternative to further reduce the physical size of a semiconductor chip. In a three-dimensional integrated circuit, the packaging is generated on the die with contacts provided by a variety of bumps. Much higher density can be achieved by employing three-dimensional integrated circuit devices. Furthermore, three-dimensional integrated circuit devices can achieve smaller form factors, cost-effectiveness, increased performance and lower power consumption.

In a three-dimensional integrated circuit, a first semiconductor die may be bonded on a second semiconductor die or a package substrate through a plurality of bumps and metal traces. In particular, a plurality of bumps may be formed on the top surface of the first semiconductor die. There may be a solder ball formed over each bump. The metal traces may be formed on the top surface of the second semiconductor die or the package substrate. The first semiconductor die may be flipped and attached to the second semiconductor die (or the package substrate) through a mating process between the bumps and their corresponding metal traces. Subsequently, a reflow process may be employed to melt the solder balls so that the bumps of the first semiconductor die and the metal traces of the second semiconductor die (or the package substrate) may form a plurality of bump-on-trace (BOT) structures. Such BOT structures help to bond two semiconductor dies (or a semiconductor die and a package substrate) together to form a three-dimensional integrated circuit.

The three-dimensional integrated circuit technology has a variety of advantages. One advantageous feature of packaging multiple semiconductor dies at the wafer level is multi-chip wafer level package techniques may reduce fabrication costs.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a stress reduction apparatus and method of at a corner of a three dimensional integrated circuit. The disclosure may also be applied, however, to a variety of semiconductor devices. Hereinafter, various embodiments will be explained in detail with reference to the accompanying drawings.

Figure 1:
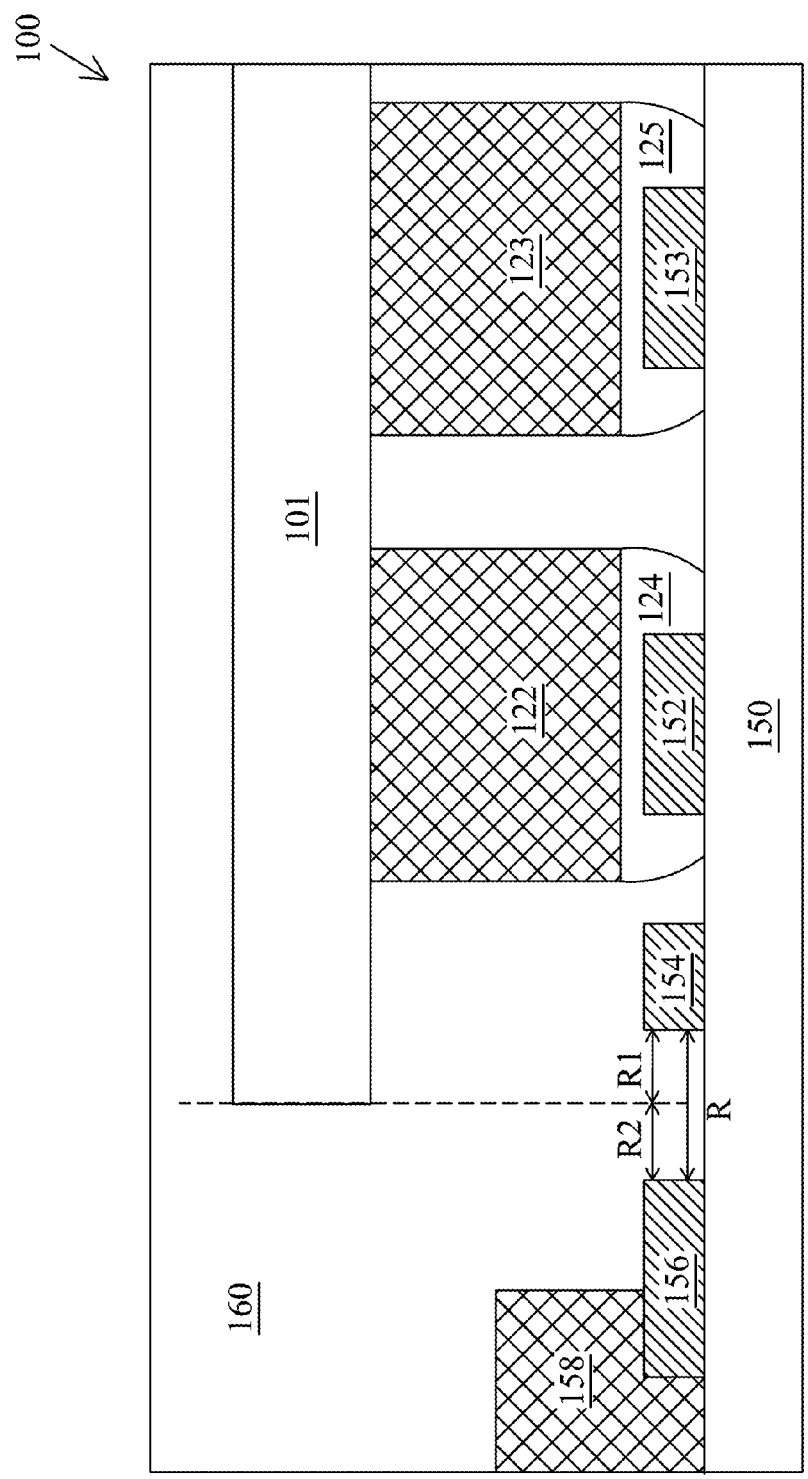
FIG. 1 illustrates a cross sectional view of a semiconductor device having dummy metal structures in accordance with an embodiment.

FIG. 1 illustrates a cross sectional view of a semiconductor device having dummy metal structures in accordance with an embodiment. A semiconductor device 100 may comprise a semiconductor die 101 and a substrate 150. As shown in FIG. 1, the semiconductor die 101 is mounted on the substrate 150 through a plurality of bump-on-trace (BOT) connectors. As shown in FIG. 1, the metal traces 152 and 153 are formed on top of the substrate 150. Metal bumps 122 and 123 are formed on a first side of the semiconductor die 101. In accordance with an embodiment, the first side of the semiconductor die 101 is the side on which active circuits are formed.

According to the fabrication process of bump-on-trace packages, there may be a solder ball (e.g., solder balls 124 and 125) formed on each metal bump (e.g., metal bumps 122 and 123) before the semiconductor die 101 is mounted on the substrate 150. Furthermore, after the semiconductor die 101 is attached to the substrate 150, the solder balls 124 and 125 may be melted through a reflow process. As a result, the semiconductor die 101 is bonded on the substrate 150.

As shown in FIG. 1, the substrate 150 further comprises a plurality of dummy metal structures (e.g., dummy metal structures 154 and 156). In some embodiments, the dummy metal structures may be a metal trace. Alternatively, it is within the scope of various embodiments for the dummy metal structures to comprise other shapes, such as, but no limited to a dummy metal plane, a polygonal shape and/or the like.

The dummy metal structures are placed between active metal traces so that the empty space on the top surface of the substrate 150 is occupied by the dummy metal structures. The dummy metal structures at the corners of the top surface of the substrate 150 may be divided into two sections such as a first dummy metal section 154 and a second dummy metal section 156 shown in FIG. 1.

In accordance with an embodiment, the first dummy metal section 154 and the second dummy metal section 156 are formed of a conductive material such as copper and/or the like. The dummy metal sections 154 and 156 are not connected to any active circuits, power sources and/or the like.

As shown in FIG. 1, the first dummy metal section 154 is separated from the second dummy metal section 156 by a distance R. The first dummy metal section 154 is separated from the edge of the semiconductor die 101 by a horizontal distance R1. The second dummy metal section 156 is separated from the edge of the semiconductor die 101 by a horizontal distance R2. In accordance with an embodiment, R is approximately equal to about 120 um. R1 is approximately equal to 60 um. R2 is approximately equal to 60 um. It should be noted that about 120 um spacing between two dummy metal sections is a minimum requirement. In other words, the distance between two dummy metal sections is at least about 120 um.

The dummy metal structures of the semiconductor device 100 can help to balance the metal density of the top surface of the substrate 150 so that some stress induced defects such as substrate warpage, layer separation and/or the like may be reduced. As a result, the electrical performance of the semiconductor device 100 may be improved. The detailed formation of dummy metal structures (e.g. dummy structures 154 and 156) will be described below with respect to FIGS. 3-5.

FIG. 1 further illustrates there may be a solder resistor layer 158 formed over the substrate 150. The solder resistor layer 158 is located at the edge of the top surface of the substrate 150. As shown in FIG. 1, the second dummy metal section 156 is partially covered by the solder resistor layer 158.

As shown in FIG. 1, there may be an encapsulation layer 160 formed over the substrate 150 as well as the semiconductor die 101. More particularly, the semiconductor die 101 is embedded in the encapsulation layer 160. In accordance with an embodiment, the encapsulation layer 160 may be a molding compound layer, an underfill layer and/or the like. Throughout the description, the encapsulation layer 160 may be alternatively referred to as a molding compound layer 160.

The molding compound layer 160 may be formed of epoxy based resins and the like. Alternatively, the molding compound layer 160 may be replaced by photo-sensitive materials including polybenzoxazole (PBO), SU-8 photo-sensitive epoxy, film type polymer materials and/or the like.

In accordance with an embodiment, the molding compound layer 160 may be an epoxy, which is dispensed at the gap between the top surface of the semiconductor die 101 and the substrate 150. The epoxy may be applied in a liquid form, and may harden after a curing process.

In accordance with another embodiment, the molding compound layer 160 may be formed of curable materials such as polymer based materials, resin based materials, polyimide, epoxy and any combinations of thereof. The molding compound layer 160 can be formed by a spin-on coating process, dry film lamination process and/or the like.

An advantageous feature of having a molding compound layer (e.g., molding compound layer 160) is that the molding compound layer 160 can help to protect the semiconductor die 101 from heat, shock, humidity and corrosion. In addition, the molding compound layer 160 helps to prevent the semiconductor device 100 from cracking during reliability tests such as thermal cycling processes. Another advantageous feature is that the molding compound layer 160 may help to reduce the mechanical and thermal stresses during the fabrication process of the semiconductor device 100.

Figure 2:
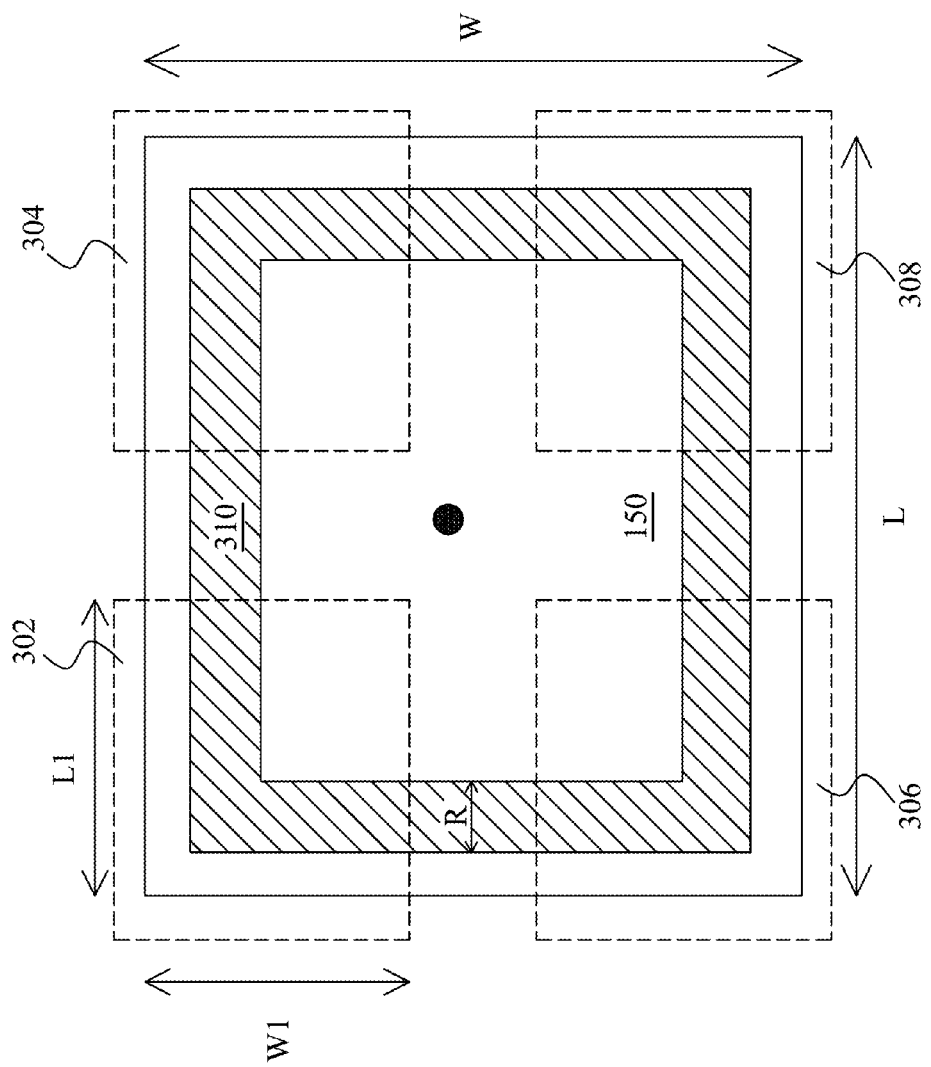
FIG. 2 illustrates a top view of an uppermost surface of the substrate shown in FIG. 1 in accordance with an embodiment.

FIG. 2 illustrates a top view of an uppermost surface of the substrate shown in FIG. 1 in accordance with an embodiment. As shown in FIG. 2, the top surface of the substrate 150 may include four corners, namely corners 302, 304, 306 and 308. As shown in FIG. 2, the width of the substrate 150 is defined as W and the length of the substrate 150 is defined as L. The corners (e.g., the corner 302) are of a length L1 and a width W1. In accordance with an embodiment, L1 is approximately equal to one-third of L. Likewise, W1 is approximately equal to one-third of W.

The top surface of the substrate 150 may further include a restriction region 310. As shown in FIG. 2, the restriction region 310 is a belt region formed along the edges of the substrate 150. The restriction region 310 may be of a width R, which is about 120 um in accordance with an embodiment. As described above with respect to FIG. 1, the spacing between two dummy metal structures is at least about 120 um.

In accordance with an embodiment, dummy metal structures (not shown but illustrated in FIG. 1) may be placed in empty space not occupied by active metal traces of the substrate 150. However, in order to further reduce the stress of the semiconductor device, the dummy metal structures may not be placed in the restriction region 310. In other words, one dummy metal structure may be broken into two pieces in order to make the restriction region 310 free of dummy metal structures. The detailed dummy metal structure placement will be described below with respect to FIGS. 3-5.

One advantageous feature of having the restriction region 310 shown in FIG. 2 is that the restriction region free of dummy metal structures may help to build strong bonding between the top surface of the substrate 150 and the subsequently formed encapsulation layer (shown in FIG. 1). Such strong bonding can prevent defects such as delamination, layer separation and/or the like from occurring.

Figure 3:
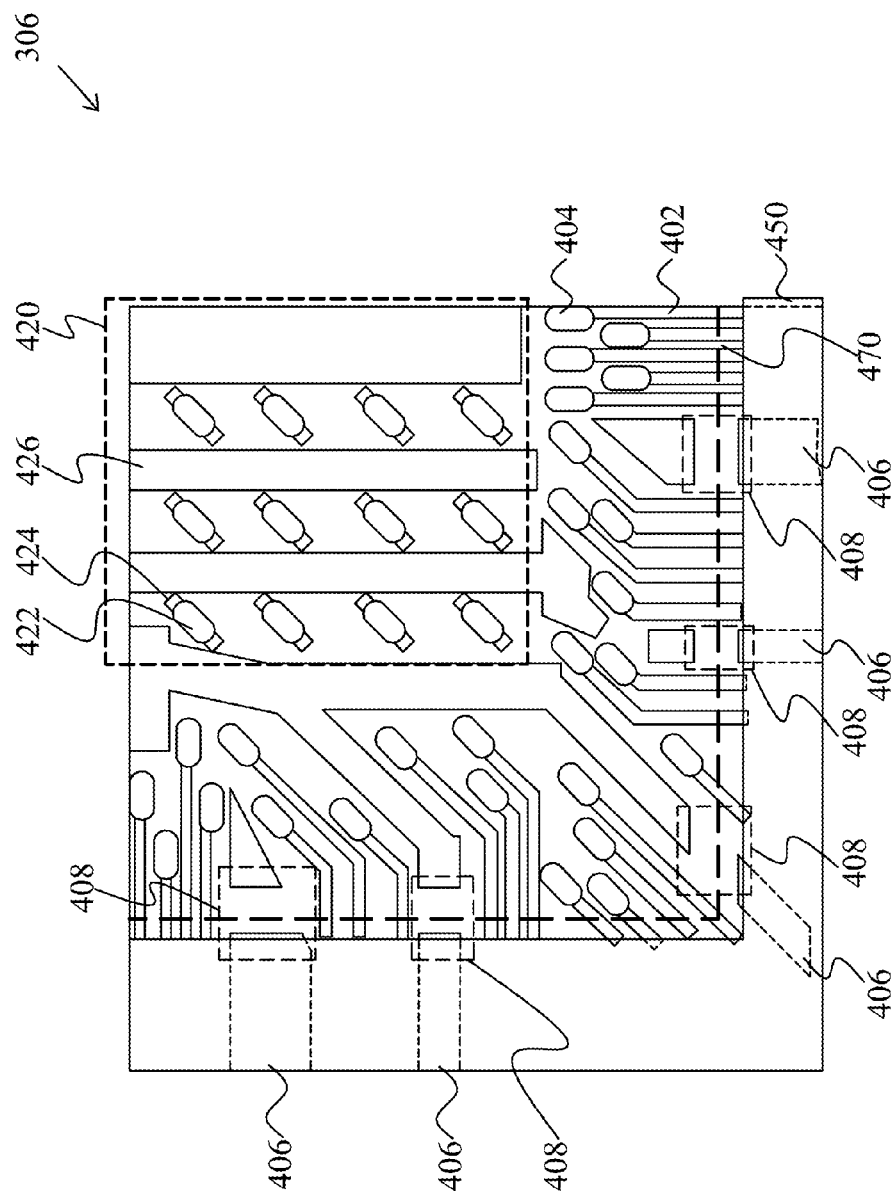
FIG. 3 illustrates a top view of a corner of a substrate having dummy metal structures in accordance with an embodiment.

FIG. 3 illustrates a top view of a corner of a substrate having dummy metal structures in accordance with an embodiment. The corner 306 of FIG. 2 is employed to illustrate the detailed structure of the dummy metal structures (e.g., dummy trace 406). The corner 306 can be divided into three portions, namely a central region 420, an edge region 450 and a peripheral region located between the central region 420 and the edge region 450.

As shown in FIG. 3, in the central region 420, there may be a plurality of elongated shaped bumps (e.g., bump 422) and traces (e.g., trace 424) arranged in rows and columns. More particularly, each bump is mounted on a corresponding trace to form a bump-on-trace structure as shown in FIG. 3. The central region 420 further comprises a plurality of dummy metal structures (e.g., dummy metal structure 426) formed adjacent to the bump-on-trace structures of the central region 420.

The edge region 450 is covered with a solder resistor layer. As shown in FIG. 3, the dummy metal structures (e.g., dummy metal structure 406) are formed under the solder resistor layer. It should be noted that the edge region 450 is located outside the edge of the semiconductor die 101, which is indicated by a dashed line 470.

The peripheral region of the corner includes a plurality of elongated shaped bumps (e.g., bumps 404) and traces (e.g., traces 402). As shown in FIG. 3, the traces at the corner of the peripheral region are oriented diagonally to the center of the substrate (not shown). In contrast, the traces far away from the corner of the peripheral region are oriented orthogonally to the edge of the semiconductor die. The peripheral region further comprises a plurality of dummy metal structures (e.g., dummy metal structures 406). As shown in FIG. 3, each dummy metal structure is not a continuous trace. Instead, the dummy metal structure is broken into two pieces as indicated by dashed rectangles 408.

The dashed line 470 indicates the edge of the semiconductor die 101 (not shown but illustrated in FIG. 1) formed over the substrate 150. As shown in FIG. 3, the first discontinuous section of the dummy metal structure is located outside the dashed line 470. The second discontinuous section of the dummy metal structure is located within the dashed line 470. In accordance with an embodiment, the distance between the first discontinuous section of the dummy metal structure and the dashed line 470 is about 60 um. Likewise, the distance between the second discontinuous section of the dummy metal structure and the dashed line 470 is about 60 um. In sum, the gap between the first discontinuous section and the second discontinuous section of the dummy metal structure is about 120 um.

One advantageous feature of having a dummy metal structure with discontinuous sections is that the dummy metal structure shown in FIG. 3 helps to improve the bonding adhesion between the dummy metal layer and the molding compound layer (shown in FIG. 1). According to an embodiment, the stress at the top surface portion of the substrate under the edge of the semiconductor die 101 is higher than other portions of the top surface of the substrate. The stress may be caused by a coefficient of thermal expansion (CTE) mismatch between the molding compound layer and the dummy metal layer.

Without removing the portion of the dummy metal structure shown in FIG. 3, the molding compound layer and the metal surface of the dummy metal structure may form poor bonding. In contrast, by removing the portion of the dummy metal structure underneath the edge of the semiconductor die 101, the molding compound layer and the exposed substrate surface may form stronger bonding at the location vulnerable to CTE induced stresses. As a result, the poor adhesion caused by the poor bonding between the dummy metal structure and the molding compound layer may be improved. As a result, some stress induced defects such as delamination may be reduced.

Figure 4:
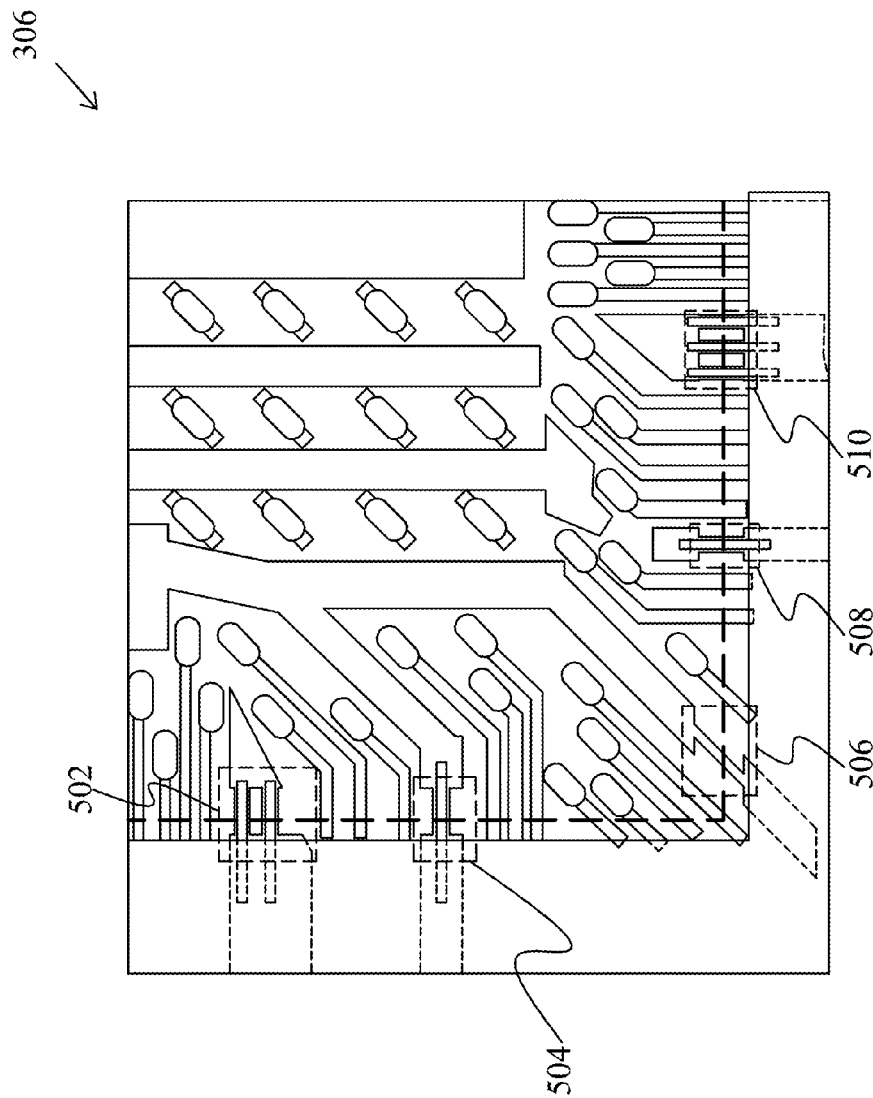
FIG. 4 illustrates a top view of a corner of a substrate having dummy metal structures in accordance with another embodiment.

FIG. 4 illustrates a top view of a corner of a substrate having dummy metal structures in accordance with another embodiment. The structure shown in FIG. 4 is similar to that shown in FIG. 3 except that there may be a thin line (shown in dashed rectangles 504 and 508) or a plurality of thin lines (shown in dashed rectangles 502, 506 and 510) coupled between two discontinuous sections of the dummy metal structure. In accordance with an embodiment, the width of the thin layer is less than 25 um.

Figure 5:
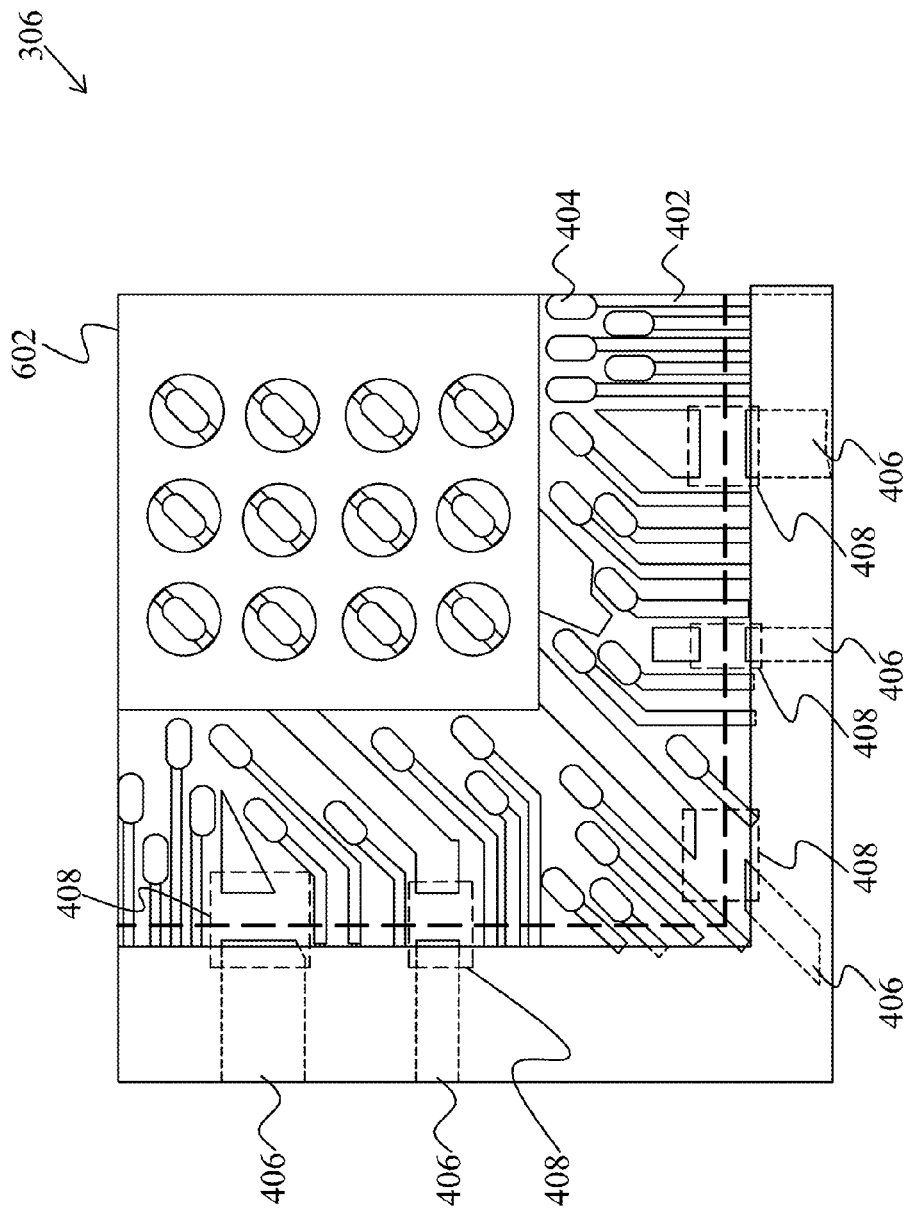
FIG. 5 illustrates a top view of a corner of a substrate having dummy metal structures in accordance with yet another embodiment.

FIG. 5 illustrates a top view of a corner of a substrate having dummy metal structures in accordance with yet another embodiment. The structure shown in FIG. 5 is similar to that shown in FIG. 3 except that the central region 602 of the semiconductor device is of a slot/trench opening solder mask feature rather than a window opening solder mask feature shown in FIG. 4.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a substrate comprising a plurality of traces on a top surface of the substrate;
   a plurality of connectors formed on a top surface of a semiconductor die, wherein the semiconductor die is bonded on the substrate and coupled to the substrate through the plurality of connectors; and
   a dummy metal structure formed at a corner of the top surface of the substrate, wherein the dummy metal structure has two discontinuous sections, and wherein a first discontinuous section is located inside an edge of the semiconductor die and a second discontinuous section is located outside the edge of the semiconductor die.

2. The structure of claim 1, wherein:
   the connectors are formed of copper; and
   the connectors and the traces form a plurality of bump-on-trace (BOT) structures.

3. The structure of claim 2, wherein the connectors comprise:
   a copper portion; and
   a solder portion formed on top of the copper portion.

4. The structure of claim 1, wherein the dummy metal structure is formed of copper.

5. The structure of claim 1, wherein the corner comprises:
   a central region comprising a plurality of bump-on-trace structures arranged in rows and columns;
   an edge region covered by a solder resistor layer; and
   a peripheral region located between the central region and the edge region, wherein a discontinuous portion of the dummy metal structure is located in the peripheral region.

6. The structure of claim 1, wherein:
   the first discontinuous section of the dummy metal structure is separated from the second discontinuous section of the dummy metal structure by a distance, and wherein the distance is greater than about 120 um.

7. The structure of claim 1, wherein:
   the corner is of a length equal to one-third of a length of the top surface of the substrate; and
   the corner is of a width equal to one-third of a width of the top surface of the substrate.

8. A device comprising:
   a semiconductor die comprising a semiconductor substrate;
   a first metal layer formed over the semiconductor substrate;
   a first dielectric layer formed on the first metal layer;
   a second metal layer formed on the first dielectric layer;
   a passivation layer formed over the second metal layer;
   a bond pad embedded in the passivation layer;
   a polymer layer formed on the passivation layer;
   a connector formed over the polymer layer; and
   a packaging substrate comprising a dummy metal structure having discontinuous sections, wherein the semiconductor die is stacked on the packaging substrate.

9. The device of claim 8, wherein a top surface of the packaging substrate comprises:
   a central region located underneath the semiconductor die;
   an edge region located outside the semiconductor die; and
   a peripheral region located between the central region and the edge region, and wherein an edge of the semiconductor die is located above the peripheral region.

10. The device of claim 9, wherein:
    a first discontinuous section of the dummy metal structure is located in a first side of the edge of the semiconductor die; and a second discontinuous section of the dummy metal structure is located in a second side of the edge of the semiconductor die.

11. The device of claim 10, wherein:

an edge of the first discontinuous section of the dummy metal structure is separated from the edge of the semiconductor die by a first horizontal distance; and an edge of the second discontinuous section of the dummy metal structure is separated from the edge of the semiconductor die by a second horizontal distance, and wherein the first horizontal distance and the second horizontal distance are equal to 60 um.

12. The device of claim 8, further comprising:

a molding compound layer formed over the packaging substrate, wherein the semiconductor die and the dummy metal structure are embedded in the molding compound layer.

13. The device of claim 8, further comprising:

a first thin line coupled between a first discontinuous section of the dummy metal structure and a second discontinuous section of the dummy metal structure.

14. The device of claim 13, wherein:

the first thin line is of a width less than 25 um.

15. The device of claim 8, wherein:

the passivation layer is a composite layer.

16. A method comprising:

forming a plurality of traces and a dummy metal structure on a top surface of a substrate, wherein the dummy metal structure comprise a first section and a second section, and wherein the first section is separated from the second section by a gap and the dummy metal structure is located at empty space between two adjacent traces;

forming a solder resistor layer on an edge region of the top surface of the substrate;

mounting a semiconductor die over the substrate, wherein the semiconductor die comprises a plurality of connectors on a first side of the semiconductor die, and wherein a central region of the top surface of the substrate is underneath the semiconductor die; and forming a peripheral region between the edge region and the central region.

17. The method of claim 16, wherein:

the gap is located in the peripheral region.

18. The method of claim 16, further comprising:

forming a first trace, a second trace and a first dummy metal structure in a corner of the top surface of the substrate, wherein:

the second trace is adjacent to the first trace in the corner of the top surface of the substrate; and the first dummy metal structure comprises a first conductive portion, a second conductive portion and a gap between the first conductive portion and the second conductive portion, and wherein the gap is located in the peripheral region and the first dummy metal structure is located at empty space between the first trace and the second trace.

19. The method of claim 18, wherein:

the corner is of a width equal to one-third of a width of the top surface of the substrate; and the corner is of a length equal to one-third of a length of the top surface of the substrate.

20. The method of claim 16, wherein the dummy metal structure comprises a thin line between the first section and the second section, and wherein the thin line is of a width less than 25 um.

* * * * *